United States Patent [19]

Engel

[11] Patent Number: 4,584,964
[45] Date of Patent: Apr. 29, 1986

[54] VISCOUS MATERIAL DISPENSING MACHINE HAVING PROGRAMMED POSITIONING

[76] Inventor: Harold J. Engel, 18932 Olympia St., Northridge, Calif. 91326

[21] Appl. No.: 782,182

[22] Filed: Sep. 30, 1985

Related U.S. Application Data

[63] Continuation of Ser. No. 560,590, Dec. 12, 1983, abandoned.

[51] Int. Cl.$^4$ .............................................. B05C 00/00
[52] U.S. Cl. .................................... 118/697; 118/679; 118/696; 118/704; 118/610; 901/43
[58] Field of Search ............... 118/697, 696, 668, 669, 118/684, 704, 679, 603, 610; 901/5, 16, 43

[56] References Cited

U.S. PATENT DOCUMENTS

| | | | |
|---|---|---|---|
| 1,994,269 | 3/1935 | Bonniksen | 118/610 |
| 2,960,060 | 11/1960 | Chatterton | 118/24 |
| 3,731,648 | 5/1973 | Gerber et al. | 118/697 |
| 3,785,898 | 1/1974 | Gerber et al. | 118/697 |
| 3,895,748 | 7/1975 | Klingenberg | 222/571 |
| 3,909,831 | 9/1975 | Marchio et al. | 118/697 |
| 3,943,527 | 3/1976 | Hartmann | 118/679 |
| 4,056,075 | 11/1977 | Seiderman | 118/696 |

*Primary Examiner*—Shrive P. Beck
*Attorney, Agent, or Firm*—Harvey S. Hertz

[57] ABSTRACT

A machine for dispensing a viscous material in a predetermined pattern onto a surface. A nozzle in the form of a chemical dispensing tip (hollow needle) is positioned in three spatial coordinates by servomechanisms controlled by a pre-programmed digital process controller. The controller also controls the emission of the viscous material through the nozzle according to a predetermined pattern of deposition. The apparatus includes vacuum/pressure pumping for degassing the viscous material in a holding tank and subsequently pressurizing it for delivery through the nozzle. A poppet type valve and actuating solenoid deterine the viscous material flow and an output chamber in communication with the nozzle includes a diaphragm and spring arrangement to provide a draw-back action when the poppet is closed to prevent dripping from the nozzle.

9 Claims, 7 Drawing Figures

VISCOUS MATERIAL DISPENSING MACHINE HAVING PROGRAMMED POSITIONING

This is a continuation of co-pending application Ser. No. 560,590 filed on Dec. 12, 1983, now abandoned.

BACKGROUND OF THE INVENTION

The invention relates to apparatus for applying viscous materials to a surface or other work according to a predetermined pattern. A typical application relates to electronic circuit boards having printed circuits and components mounted thereon. A typical process for securing the leads of discrete components, such as resistor, capacitors and semi-conductor units, to the printed conductors comprises flow or dip soldering. A circuit board designed to be soldered in that manner would ordinarily have the discrete components mounted on one side of the board with their leads feeding through holes or eyelets associated with the opposite side of the board, the solder being deposited to accomplish electrical connections where desired.

In the typical circuit board as aforementioned, there are always areas exposed to the soldering process which must be protected from unintentional solder connection, hence the practice of masking those areas has become conventional. Obviously such masking may be applied manually, although that approach is tedious and time-consuming and therefore economically disadvantageous.

DESCRIPTION OF THE PRIOR ART

In the prior art, various machines are extant which address the general problem of controlled and selective deposition of paint, adhesives, resins and the like. The concepts employed in those known devices are recognized as general background for the invention, and some aspects of the combination of the invention are conventional per se. These will be identified as the description proceeds.

One early example of programmed deposition of a coating material is described in U.S. Pat. No. 3,606,162. The combination of that patent includes spray guns and is not adapted for the very selective application of material required for such work as electronic circuit board masking. Rather, the programming provided is intended to insure the uniform coating (painting) of a work object having a shape unadapted to application of the coating by conventional passive, assembly-line spraying.

Another example of automated control of a paint spray station is shown in U.S. Pat. No. 3,646,521. That patent indicates at the outset that it is known to sense electronically, the horizontal dimension and position of a work object to be sprayed as it is conveyed past a spray station. Moreover, it was recognized that also sensing of the vertical height of the work object is known, the spray being accordingly controlled to afford a uniform coating without wasteful overtravel of the spray apparatus. To accomplish such a control program, it is known to develop a digitized signal (by electro-optical means, for example) representative of the dimensions of the work object to be sprayed and to feed that digitized information into a shift register or registers. The output of the shift register(s) is then employed to activate a spray gun or gun assembly. In U.S. Pat. No 3,646,521, the teachings appear to consist of substituting a single memory storage matrix for storing the determined work object dimensional character rather than to use a number of registers each relating to a corresponding vertical zone as said to be the case in the earlier system disclosed in U.S. Pat. No. 3,593,308.

In U.S. Pat. No. 4,056,075 apparatus for the deposition of hot melt adhesive is shown. The deposition rate is controlled and the movement of the glue nozzle along a rectilinear path along the work surface are controlled by analog mechanical (cam) means.

U.S. Pat. No. 3,252,441 also deals with the application of glue or similar adhesive material by means of a gum-like applicator, however the control features disclosed appear to be limited to analog devices, such as photocells, acting as "trigger" devices to initiate and terminate adhesive flow as passage of the work is detected.

Still further, U.S. Pat. No. 3,909,831 describes a fluid applicating device associated with an automatic plotter useful in the garment industry for layout of pattern forms. An X-Y plotter under computer control is contemplated, and means are described for controlling the flow of the deposited fluid (ink) in accordance with the nozzle velocity in the plane of deposition as a pattern coutour is traced out.

None of the above prior art devices is concerned with the problem and required performance hereinbefore set forth as the environment of the invention. Moreover, none of these references would be suitable, with modifications which could be described as obvious to the person of skill in this art, to provide the accurately controlled deposition of masking material on the small surface points and lines where solder masking is required on the typical electronic printed circuit board.

As the invention is thoroughly understood from the description to follow, other applications will suggest themselves to the reader, such as resin deposition for the physical stabilization (holding down) of small electronic components on a circuit board and masking prior to conformal coatings (tropicalization treatment), to mention two additional applications for the machine of the invention.

The manner in which the invention advances the relevant art through provision of an unique and highly advantageous novel combination will be evident as this description proceeds.

SUMMARY OF THE INVENTION

It may be said to have been the general objective of the invention to provide a programmable machine for depositing a viscous, semi-liquid material onto a surface, such as the surface of an electronic circuit board for pre-soldering masking.

A digitally controlled positioner is formed through the combination of a programmable digital controller and a three axis, servomechanism controlled electromechanical locator. The circuit board or other work surface remains fixed on a bed plane which is part of the machine according to the invention. A downwardly U-shaped frame is slideably mounted and is servoed to each programmed Y-axis position by a lead screw driven by a stepper motor. Similarly, a tool mount is driven by a second lead screw to X-axis position the tool mount across and in the plane of the U-shape frame. A Z-axis motion, also servo driven and responsive to digital commands fixes the clearance of the tool (nozzle in this case) over the work. It should be mentioned at this point that, in some relatively simple operation where a Z-axis clearance of the nozzle over the work can be constant, a preliminary setting may suffice, eliminating the need for programmed (variable) Z-axis values throughout operation. If the work surface is convoluted or curved in the Z-axis, the programmed Z-axis clearance is, of course, required.

The U-shaped frame is suggestive of a miniature gantry crane in its form, and is also referred to hereinafter as the "bridge."

Two particularly important and especially novel features of the combination include the anti-drip (draw-back) feature of the solenoid-operated valve and nozzle assembly. (The terms "solenoid" or "solenoid-operated valve" as used hereinafter are to be understood to include pneumatically or hydraulically operated valves, as well as the electromagnetically operated arrangement specifically described.) The draw-back is effected by slightly increasing the volume of a chamber (fluid plenum) between the valve output and the chemical dispensing tip (hollow needle which form and is hereinafter referred to as the nozzle) after closure of the valve.

The other of the two above-referenced especially novel aspects of the combination comprises a vacuum-pressure arrangement whereby the closed reservoir of the viscous material to be applied is subjected to a partial vacuum by partial evacuation of the air space (void) between the reservoir top and the level of the material. That operation is operator initiated and later switched to a pressure mode to provide pneumatic drive for the viscous material throughout the machine to the point of emission from the nozzle.

The details of a typical embodiment of the machine and further information respecting its operation will be presented hereinafter.

DETAILED DESCRIPTION

Figure 1:
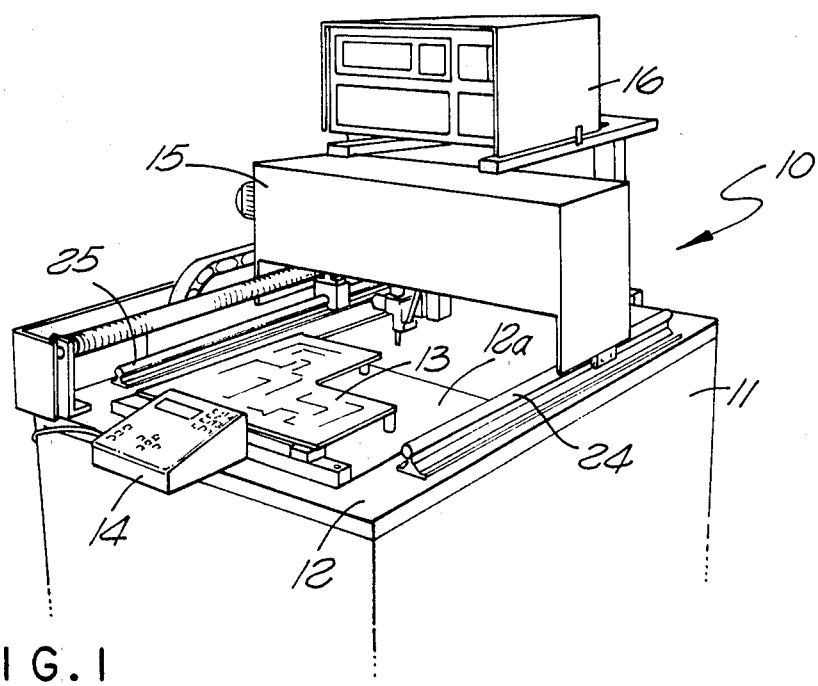
FIG. 1 illustrates a typical form of the machine according to the invention in pictorial form.

Referring now to FIG. 1, an overall view of the machine of the invention is seen in a typical physical configuration at 10. A base structure 11 has a base surface 12, to which the functional parts of the combination are fixed, and to which the work (circuit board 13 or the like) is secured. A control box 14 provides the conventional electrical switching for operation including overriding of the servo-mechanism control signals. Those electrical controls are suggested symbolically and the required controls will be evident to the skilled reader once the structure and function of the machine are described hereinafter.

The digital controller 16 is a conventional device available as an ordinary item of commerce. Its functions will be evident as the description proceeds.

Figure 2:
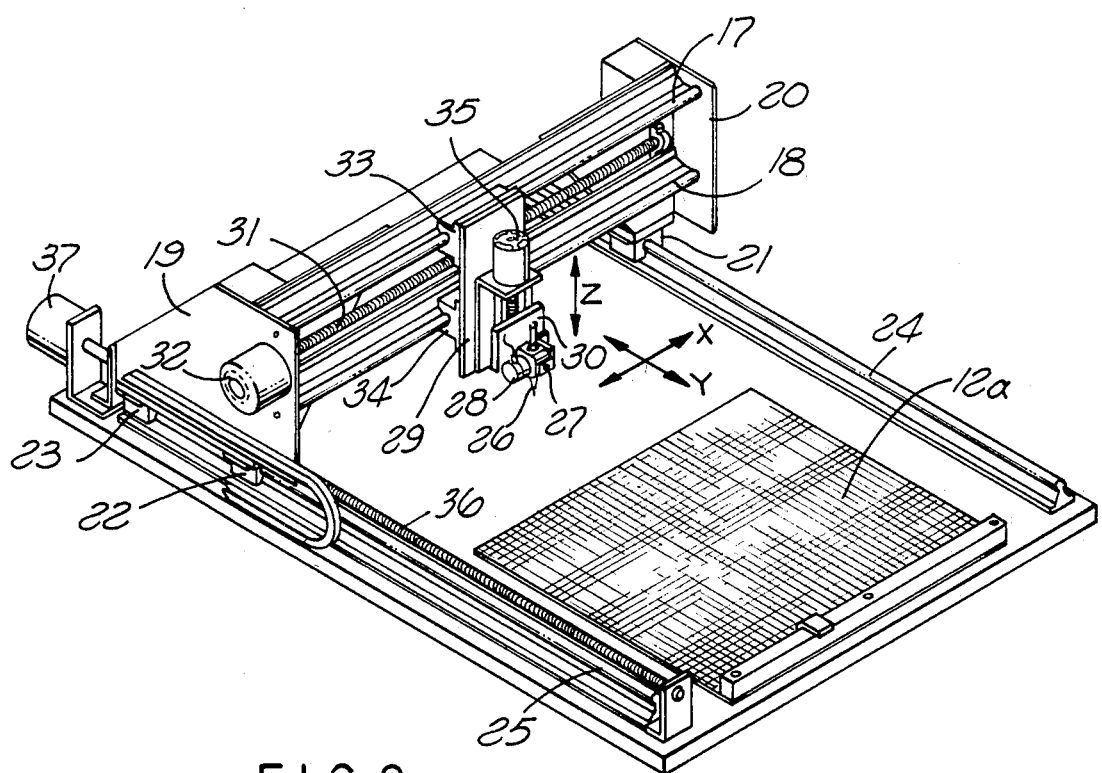
FIG. 2 illustrates the bridge and base surface of the machine without the bridge mechanism cover.

In FIG. 2, it will be noted that the U-shaped structure referred to as the bridge is actually structurally comprised of lateral slide rails 17 and 18 mounted to an end-plate assembly at each end 19 and 20. The slide rails 17 and 18 may be thought of as comprising the base of the U-shape of the bridge and the pair of sliders such as 22 and 23 comprise one leg of the shallow U-shape. At the other end of the bridge only slider 21 is visible. A layout grid 12a is secured to the base surface 12 and is used to position the circuit board 13 thereon.

The sliders 21, 22, and 23 include precision, low-friction roller bearings so that they translate along the rounded tops of slide rails 24 and 25.

The arbitrarily identified axes of motion X, Y, and Z are identified for reference, the Z-axis denoting the positioning of the nozzle 26 vertically with respect to the circuit board 13. The valve assembly 27 and operating solenoid 28 associated with nozzle 26 will be explained in detail subsequently.

The tool carriage 29 with sub-carriage 30 moves as a unit in the X coordinate driven by lead screw 31 from stepper motor 32, a low friction bearing as included at slider 21, etc., being present at 33 and 34 for low friction travel. The Z-axis motion moves the sub-carriage 30 in the vertical plane with respect to the main tool carriage 29, in accordance with a lead screw driven by stepper motor 35. The Y-axis motion will be understood to be effected by lead screw 36 coupled to Y-axis drive motor 37.

Figure 3:
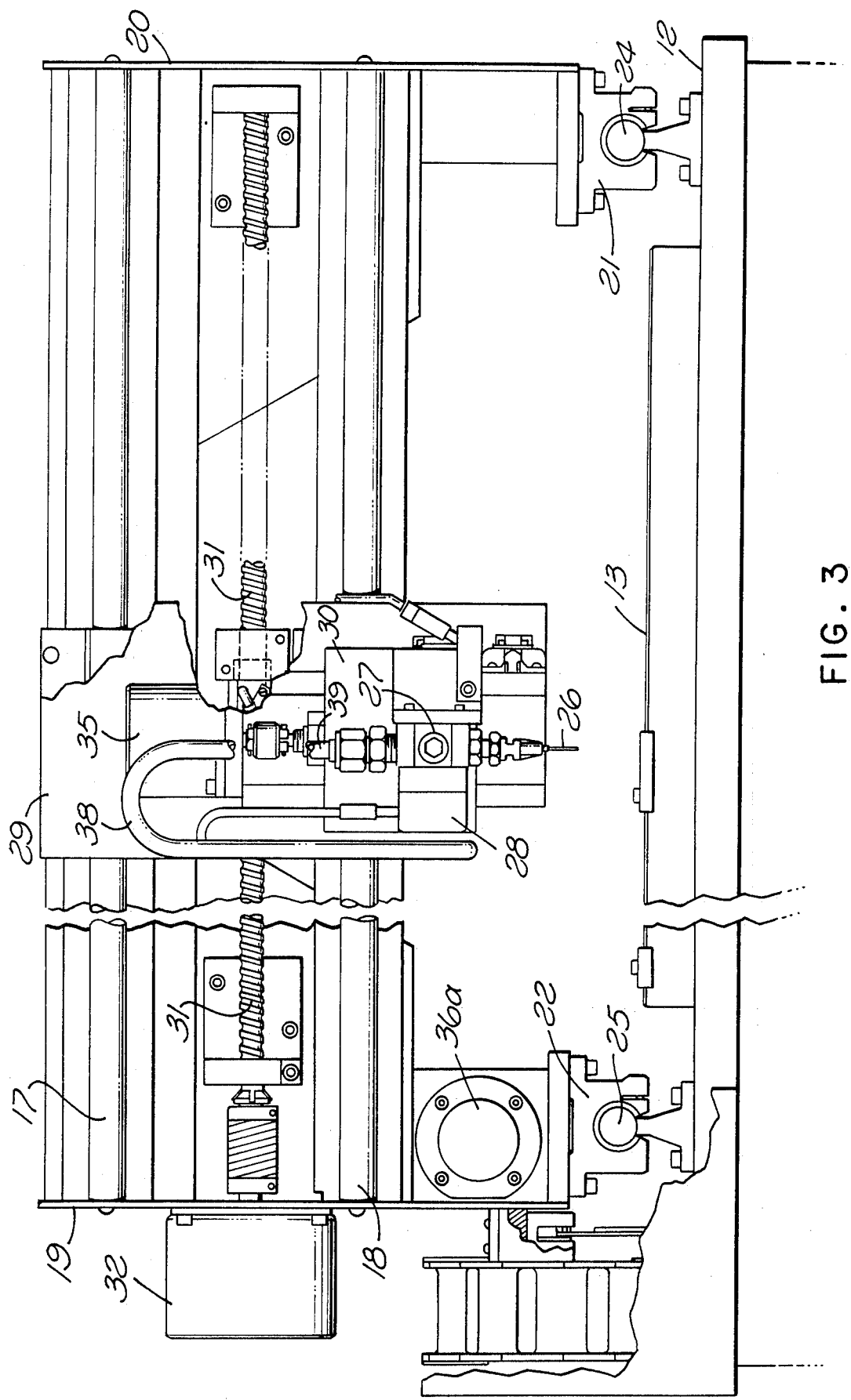
FIG. 3 depicts further mechanical details of the bridge mechanisms.

From FIG. 3 the nature of the mechanical features of the X-, Y-, and Z- axis drives aforementioned can be more fully appreciated. The flexible viscous material feed conduit 38 connects to inlet 39 of the solenoid-operated valve 27. Flexible electrical cabling will be understood to be required for the Z-axis motor 35. The legend 36a identifies the ballscrew nut and mounting at the end of lead screw 36 opposite from the end driven by motor 37.

Elements depicted in FIG. 3 also identified in FIG. 2 have been explained. However, FIG. 3 is intended to depict the mechanical aspects of FIG. 2 with more clarity for the benefit of the skilled reader.

Figure 4:
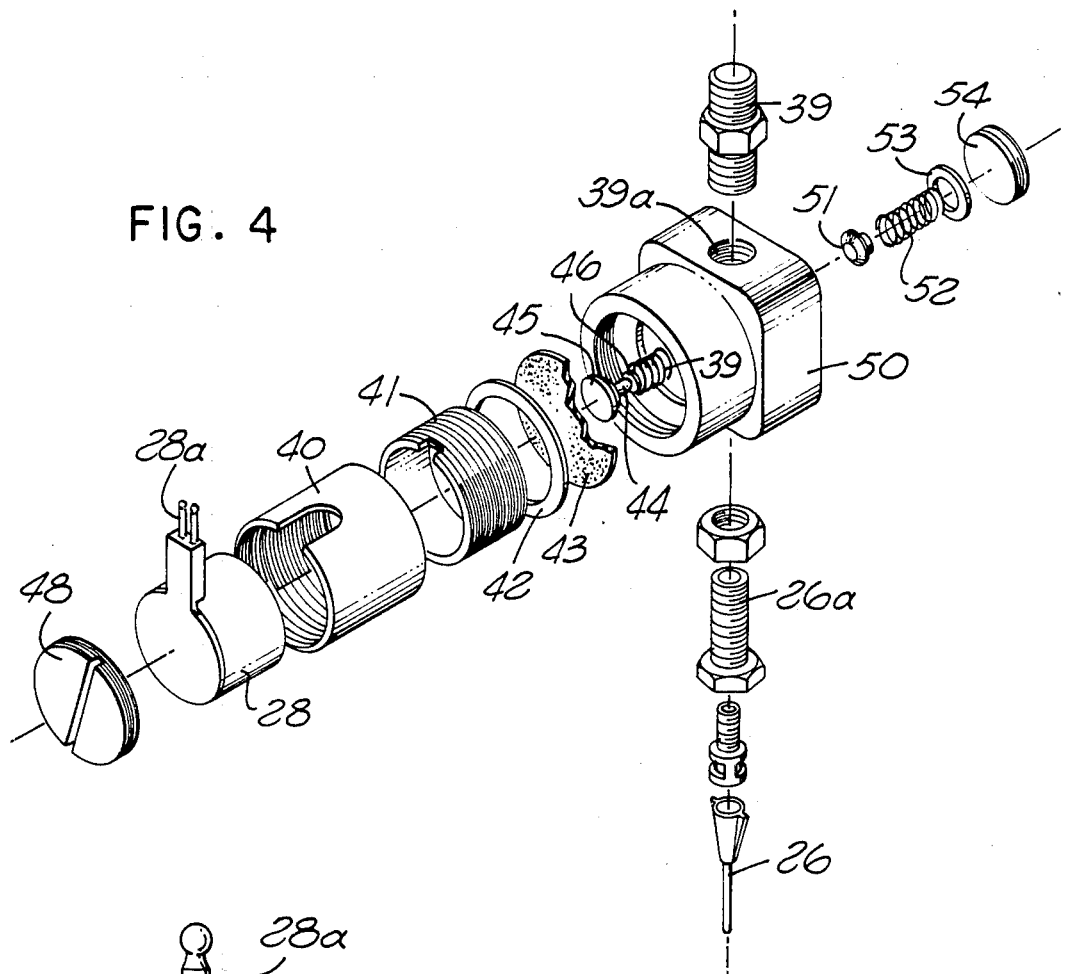
FIG. 4 is an exploded pictorial view illustrating the construction of the solenoid valve and nozzle assembly.
Figure 5:
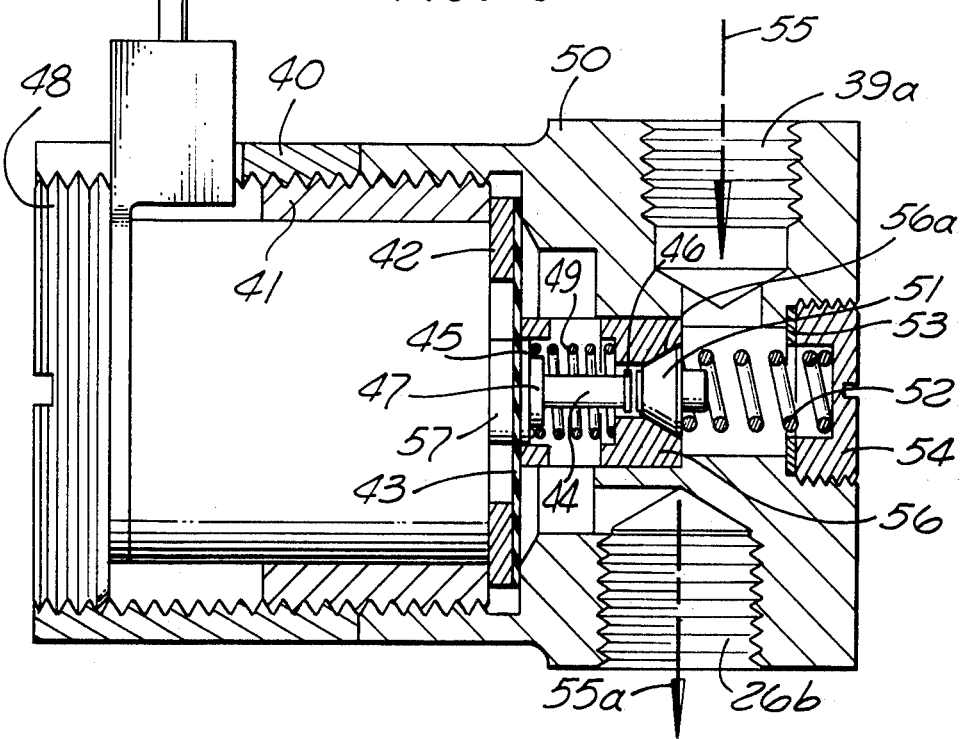
FIG. 5 is a sectional view of portions of FIG. 4 as assembled for operation.

Referring now to FIG. 4, the details of the solenoid-operated valve will be explained with contemporaneous reference to FIG. 5 showing the FIG. 4 elements assembled (in a sectional view).

The nozzle 26 which has been previously identified as a chemical tip (hollow needle) is associated with a hollow threaded tube 26a which is screwed into a threaded bore 26b in the valve body 50. Similarly, the pressurized viscous material input is coupled by means of a threaded connection between inlet valve 39 and threaded bore 39a in the valve body 50.

The solenoid 28 (having electrical connections 28a) is inserted into an internally threaded housing shell 40, a cap 48 being screwed into said housing 40 to retain the solenoid 28. The threaded sleeve 41 resides within shell 40 as indicated in FIG. 5 and the resilient diaphragm 43 is held against an internal portion of the valve body 50 with the help of washer 42. A spring 49 compresses the stem 44 against diaphragm 43 which is backed by solenoid core pin 57 in its fully retracted position (solenoid not energized). The stem 44 has a head flange 45 against which spring 49 bears, the spring 49 acting against an internal surface of valve seat 56 as shown. The opposite end of stem 44 is formed into a smaller head shape 46 which faces the smaller base of the truncated valve plug 51 during this quiescent condition. The valve plug 51 is seated and retained within the conical bore in seat 56 by spring 52 acting against the inside surface of retainer cap 54 contacting the inside flat of a right end bore in body 50 through sealing washer 53. The inlet bore 39a is in communication with a chamber thereby formed in body 50 and containing spring 52.

The larger base of the truncated cone valve plug member 51 faces this chamber and therefore is subjected to the inlet pressure, but no flow into the output chamber containing spring 49 and stem 44 occurs since plug 51 is firmly seated against conical interface 56a.

When the solenoid 28 is energized, the core pin 57 is thrust outward (to the right as viewed on FIG. 5), deflecting the central portion of diaphragm 43 and urging stem 44 against the smaller base of plug 51. This partially dislodges plug 51 from seat 56 permitting flow of the viscous material in the gap thereby created at interface 56a.

When the solenoid is again de-energized, spring 49, which bears on stem head flange 45 (retained laterally by a shoulder 47), shifts stem 44 leftward (as viewed in FIG. 5 and plug 51 again seats into valve seat 56 terminating the flow of viscous material. The gap between the stem smaller head 46 and the smaller base of the truncated cone plug member 51 reappears and the diaphragm 43 is again deflected toward the solenoid 28. This action will be seen to produce a draw-back of material in the nozzle 26 since the chamber surrounding spring 49 and stem 44 is thereby slightly increased in volume. The amount of diaphragm deflection is small, typically only 0.010 inches in a representative embodiment for the purpose described. For different nozzle bores and different viscosities of viscous material, empirical determination is relied upon for the optimum diaphragm deflection. For example, the length of the stem 44 could be selected such that the valve plug is well seated before the deflection of the diaphragm (to the left as seen in FIG. 5) can produce the output chambers volume increase described and the consequent drawback (drip prevention) action. Alternatively, the position and/or size of the valve seat 56 could be moved axially in or out to accomplish the same objectives.

Figure 6:
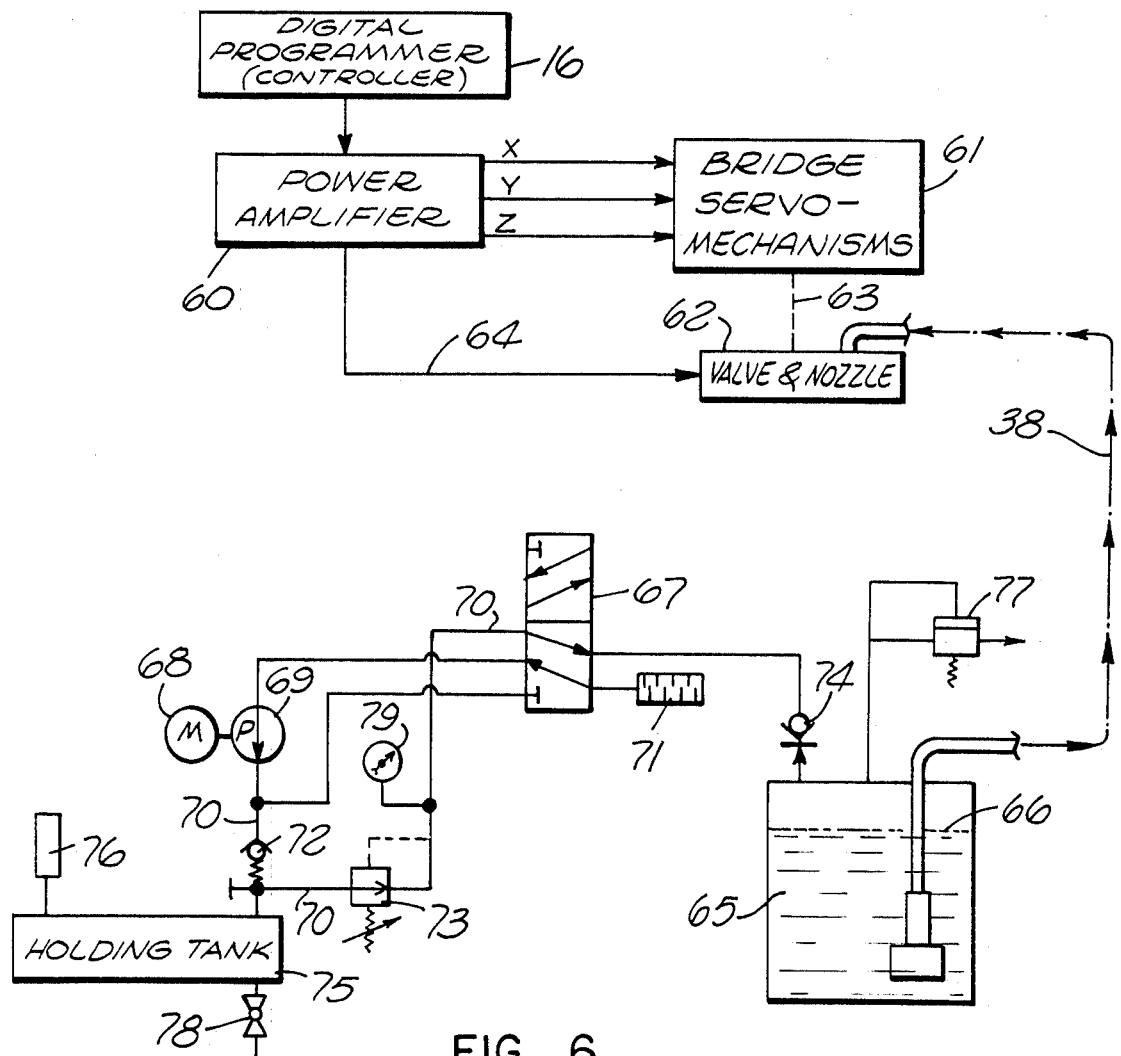
FIG. 6 depicts an electrical and pneumatic block diagram of the system in the pressure (operating) mode.

Referring now to FIG. 6, the overall form and functional aspects of the system can be appreciated. The digital controller (programmer) 16 is followed by a power amplifier having X,Y, and Z position command outputs which drive the corresponding bridge servo-mechanisms to position the valve and nozzle assembly 62 (comprising carriage 29, sub-carriage 30 and the solenoid and valve components 28 and 27 as previously described) successively in accordance with the program installed in controller 16. The dashed line 63 depicts the mechanical linkage between servos 61 and the components aforementioned as grouped under block heading 62. The power amplifier also handles the solenoid control electrical function (lead 64), again as dictated by controller 16.

The remainder of FIG. 6 concerns the pressure/vacuum functions. The conduit 38 conveys the viscous material from closed reservoir 65 containing the semi-liquid material to level 66 driven by pressure developed by pump 69 driven by motor 68. In FIG. 6 the pressure/vacuum manual mode switch 67 is of a type which provides passages in accordance with its sliding position covering and uncovering a plurality of parts to provide pneumatic continuity in accordance with arrows within switch block 67. In FIG. 6, air is drawn from the atmosphere through muffler 71, into pump 69 and out under pressure at lead 70, through spring loaded check valve 72 and through regulator 73 and back through another passage within switch 67 and into the void space above the level 66 of the material in reservoir 65 after passing through quick disconnect 74. The holding tank 75 acts as a pneumatic accumulator, overpressure switch 76 detecting any abnormally high pressure condition in tank 75. Still further, relief valve 77 operates as a blow-off for safety against abnormally high pressure in reservoir 65. Element 78 is a drain cock for moisture disposal during non-operating conditions.

Figure 7:
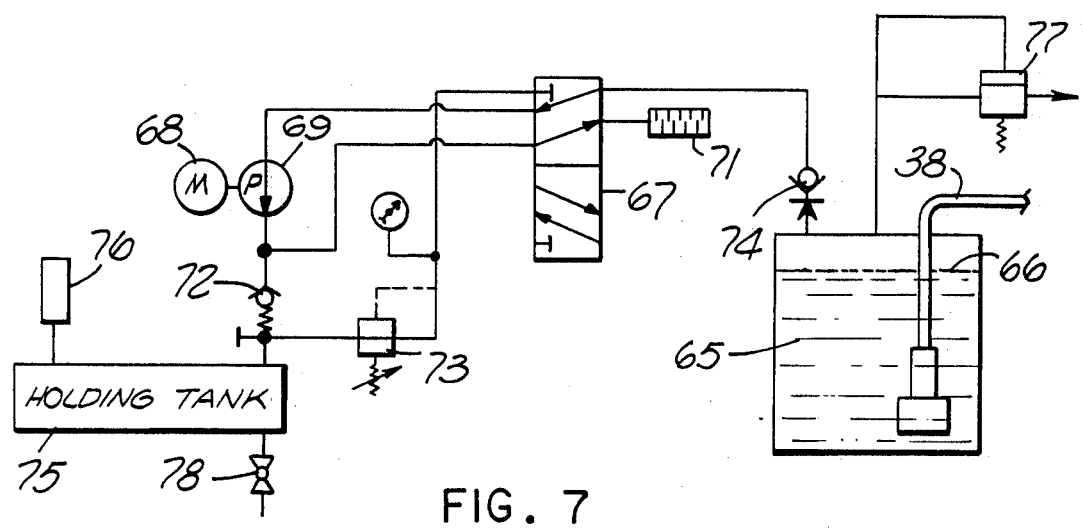
FIG. 7 depicts the electrical and pneumatic block diagram of the system in the vacuum (degassing) mode.

In FIG. 7, the pneumatic switch 67 has been moved to the vacuum (degassing) position. Here the void above level 66 in reservoir 65 is partially evacuated by pump 69 which now draws from that void in reservoir 65 through quick disconnect 74 and discharges into the atmosphere at muffler 71. In this (vacuum mode the holding tank 75, pressure regulator 73 and related components have no functions. Tracing of lines through switch 67 demonstrates this. Gauge 79 functions only in the pressure mode to give a visual pressure indication.

Degassing by the partial vacuum technique reduces the presence of bubbles of air or other gasses in the viscous material and need only be applied for a relatively short empirically determined time. Longer degassing may cause volatilization of solvent vehicles in the viscous material and accordingly a controlled experimentally determined degassing program, for the particular viscous material used, is important.

It should be noted that the stationary work feature of the invention is of itself unique in the art. Prior art apparatus generally relied on stationary nozzle and controlled positioning of the work, the present invention thus eliminating the need for extensive mechanical apparatus to feed and position the work.

Modifications and variations of the specific implementation described will suggest themselves to those of skill in this art, once the concepts of the invention are understood. Accordingly, the scope of the invention is not intended and described, these being typical and illustrative only.

What is claimed is:

1. A machine for accurately and selectively depositing a viscous material at predetermined locations on a surface, comprising:

first means including a nozzle and a closed reservoir for containing said viscous material under predetermined pressure;

second means including a controllable valve assembly and a fluid conduit in series between said nozzle and said reservoir, said valve assembly being responsive to a flow control signal for correspondingly controlling emmission of said viscous material;

third means including a servomechanism for positioning said nozzle with respect to said surface in response to position control signals;

fourth means including a programmable controller for generating and applying said position control signals to said servomechanism in a sequence corresponding to a predetermined program extant in said controller;

fifth means within said second means comprising a valve assembly housing, an axially operative poppet valve within said housing and connected to said fluid conduit at its input side, an axially operative solenoid for opening said valve in response to said flow control signals and a chamber within said housing between the output side of said poppet valve and said solenoid, said nozzle being connected to said chamber, said poppet valve having a stem projecting axially at its output side and said solenoid having a core pin projecting axially toward said poppet stem and contacting and axially translating said stem to open said poppet valve when said solenoid is energized by said flow control signal;

sixth means comprising a resilient diaphragm at the end of said chamber adjacent said solenoid forming at least a portion of the wall of said chamber, said resilient wall deflecting to decrease the volume of said chamber in response to operation of said solenoid;

and first spring means arranged to restore said resilient wall to its position prior to energizing of said solenoid when said solenoid is de-energized thereby to increase the volume of said chamber to produce a draw-back effect at said nozzle.

2. The combination set forth in claim 1 further defined in that said first spring means is a coil spring coaxial with said solenoid core pin, said first spring acting in compression between said resilient wall and a portion of said housing.

3. The combination set forth in claim 2 further defined in that said solenoid is electrically operated and said flow control signal is an electrical signal, said fourth means including circuits for generation of said flow control signal synchronized with said position control signals.

4. The combination defined in claim 2 in which second spring means is included operative against the input end of said poppet valve to hold said valve closed when said solenoid is de-energized.

5. The combination set forth in claim 1 further defined in that said solenoid is electrically operated and said flow control signal is an electrical signal, said fourth means including circuits for generation of said flow control signal synchronized with said position control signals.

6. The combination set forth in claim 5 further defined in that said poppet valve includes a generally conical plug and a generally conical valve seat, said plug and seat having their greatest diameters at said valve input, said predetermined reservoir pressure acting through said fluid conduit to close said poppet valve when said solenoid is de-energized.

7. The combination set forth in claim 1 further defined in that said poppet valve includes a generally conical plug and a generally conical valve seat, said plug and seat having their greatest diameters at said valve input, said predetermined reservoir pressure acting through said fluid conduit to tend to close said poppet valve when said solenoid is de-energized.

8. The combination defined in claim 7 in which second spring means is included operative against the input end of said poppet valve to hold said valve closed when said solenoid is de-energized.

9. The combination set forth in claim 1 further comprising a sixth means including a gas pump and operator controlled means for effecting connection of the input of said pump to the void volume within said reservoir over the level of said viscous material in a first mode for degassing said viscous material, said operator controlled means alternatively connecting the output of said pump to said void volume for pressurization to provide flow drive if said viscous material to said controllable valve in a second mode, said sixth means further including first and second valving arrangements for venting the output of said pump to the atmosphere in said first mode and for drawing from the atmosphere at the input of said pump during said second mode.

* * * * *